(12) United States Patent
Picard et al.

(10) Patent No.: US 6,507,149 B1
(45) Date of Patent: Jan. 14, 2003

(54) PLASMA CELL

(75) Inventors: Emmanuel Picard, St Martin d'Vriage (FR); Noël Magnea, Muirmus (FR)

(73) Assignee: Commissariat a l 'Energie Atomique, Paris (FR)

( * ) Notice: Subject to any disclaimer, the term of this patent is extended or adjusted under 35 U.S.C. 154(b) by 0 days.

(21) Appl. No.: 09/531,182

(22) Filed: Mar. 21, 2000

(30) Foreign Application Priority Data

Apr. 1, 1999 (FR) .............................. 99 04083

(51) Int. Cl.$^7$ .......................... H01J 17/49; H01J 61/20
(52) U.S. Cl. ....................... 313/582; 313/639
(58) Field of Search ................. 313/639, 493, 313/609, 610, 582

(56) References Cited

U.S. PATENT DOCUMENTS 5,427,747 A 6/1995 Kong et al.

FOREIGN PATENT DOCUMENTS

| FR | 2355375 | 1/1978 |
|----|---------|--------|
| JP | 01 060926 | 3/1989 |

*Primary Examiner*—Sandra O'Shea
*Assistant Examiner*—Bao Q. Truong
(74) *Attorney, Agent, or Firm*—Thelen Reid & Priest LLP; Robert E. Krebs

(57) ABSTRACT

The invention relates to a plasma cell able to be fixed in a vacuum chamber by means of a first flange, having an outer envelope in which a gas under pressure (P') is added and provided in its upper part with a discharge opening, and electrodes, at least one anode and one cathode, arranged in said envelope and mounted on a second flange, to whose terminals a voltage may be applied, such as to cause ionization of the gas producing the monoatomic species which are to be discharged through the opening. Electrodes can be dismounted and are assembled on a second removable flange. Electrically insulated separation means are provided between cathode and anode(s). A gas inlet opening is provided in the lower part of the envelope.

10 Claims, 2 Drawing Sheets

PLASMA CELL

DESCRIPTION

1. Technical Field

The present invention relates to a plasma cell.

2. Prior Art

Different plasma cells are available on the market at the present time. These are:

- hot filament cells which are cells of simple design which can be solely used to produce monoatomic hydrogen; diatomic hydrogen dissociating itself through the energy supplied by a filament brought to a high temperature;
- radio frequency and cycloelectronic resonance plasma cells, which are cells requiring complicated, very costly manufacturing, and producing ionized species which may damage surfaces;
- continuous discharge plasma cells.

One cell of this latter type, available on the market and described for example in the document referenced (1) at the end of this disclosure, is illustrated in FIG. 1. It is made up of a discharge tube 10 which curves backwards and is mounted on an ultravacuum flange 11 of CF 35 type enabling its fixation in a vacuum chamber 19, in which pressure is in the region of $10^{-5}$ to $10^{-6}$ mbar. This Figure illustrates a quartz tube 12, platinum electrodes 13 and their electrical connections 14, a thermal glass tube 15 and a tube in stainless steel 16. The upper part of the cell is fitted with a protective cover 17 and has a cone-shaped opening 18 through which the plasma can exit. A first flange 20 of CF 16 type provides for the addition of oxygen and a second flange 21 of the same type provides for connection to a pumping system.

A plasma is set up between the two electrodes 13 by applying a direct voltage of a few thousand volts, the current thus generated possibly varying from 20 mA to 40 mA. Ionization of the gas produces monoatomic species which exit through opening 18 and which come to react with sample 22 situated opposite the latter.

The major drawback of said cells lies in the presence of glass-metal soldering and their fragility, which means that they cannot be dismounted. These cells cannot be cleaned (deposits form on the cell walls) and therefore have a fairly short lifetime. Also, since the electrodes are not interchangeable, these cells are therefore "monogas" cells and must be replaced for each new application, the creation of an atomic species requiring the association of a gas and a specific electrode: Pt for $O_2$—Stainless steel for $H_2$—Mo for $N_2$ . . .

The purpose of the invention is to remedy the disadvantages of these cells of the prior art by providing a low-cost plasma cell, that is easy to maintain, having easily interchangeable electrodes and which can therefore be used with different types of gas.

DISCLOSURE OF THE INVENTION

The present invention relates to a plasma cell, able to be fixed into a vacuum chamber by means of a first flange, comprising an outer envelope in electric insulating material in which a gas under pressure is placed and provided in its upper part with a discharge opening, and electrodes, at least one anode and one cathode, arranged in said envelope and mounted on a second flange, at whose terminals a voltage can be applied such as to produce ionization of the gas producing the monoatomic species to be discharged through the opening, characterized in that it comprises electrodes that can be dismounted and are assembled on a second removable flange, electrically insulated separation means arranged between the cathode and anode or anodes, and a gas inlet opening.

In one advantageous embodiment, the envelope is in the shape of a glass bell. The separation means are formed of a quartz tube arranged around the cathode. The electrodes, which comprise several anodes, are arranged such as to allow electric selection of an anode. The gas inlet opening is located in the lower part of the envelope situated between the two flanges.

Advantageously, said cell can be used to create monoatomic species of different gases. Its lifetime is unlimited since it can be cleaned and the electrodes can be changed. Also, its manufacturing is much simplified.

It can be used to produce atomic species of gas from molecular sources such as hydrogen, oxygen, nitrogen, in a vacuum chamber. The monoatomic species formed in this way can, being highly reactive, be used either to dope or to change surface condition (cleaning, deoxidation, oxidation).

DETAILED DESCRIPTION OF EMBODIMENTS

Figure 2:
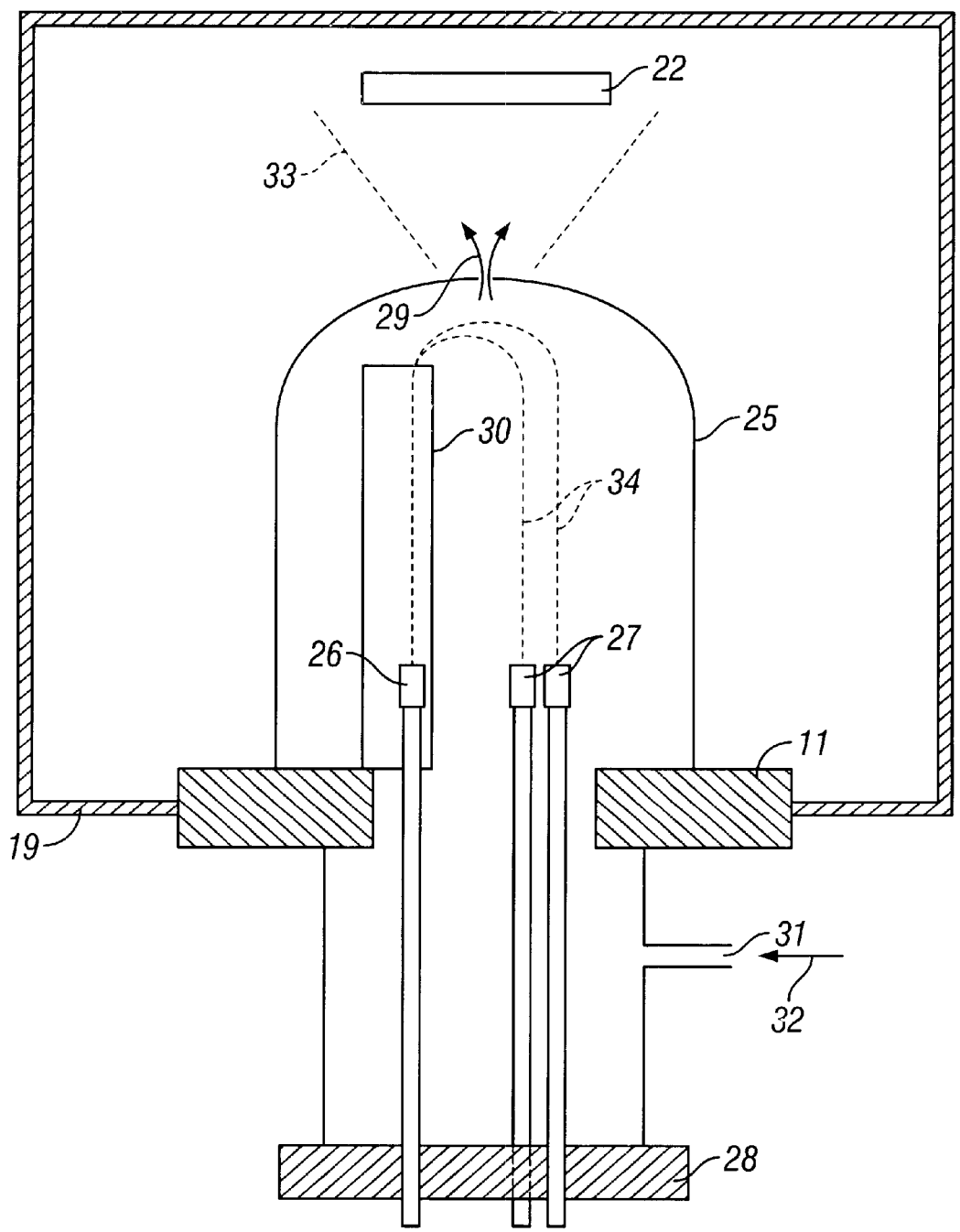
FIG. 2 is a diagram illustrating a plasma cell of the invention arranged in a vacuum chamber.

The plasma cell of the invention is illustrated in FIG. 2.

Figure 1:
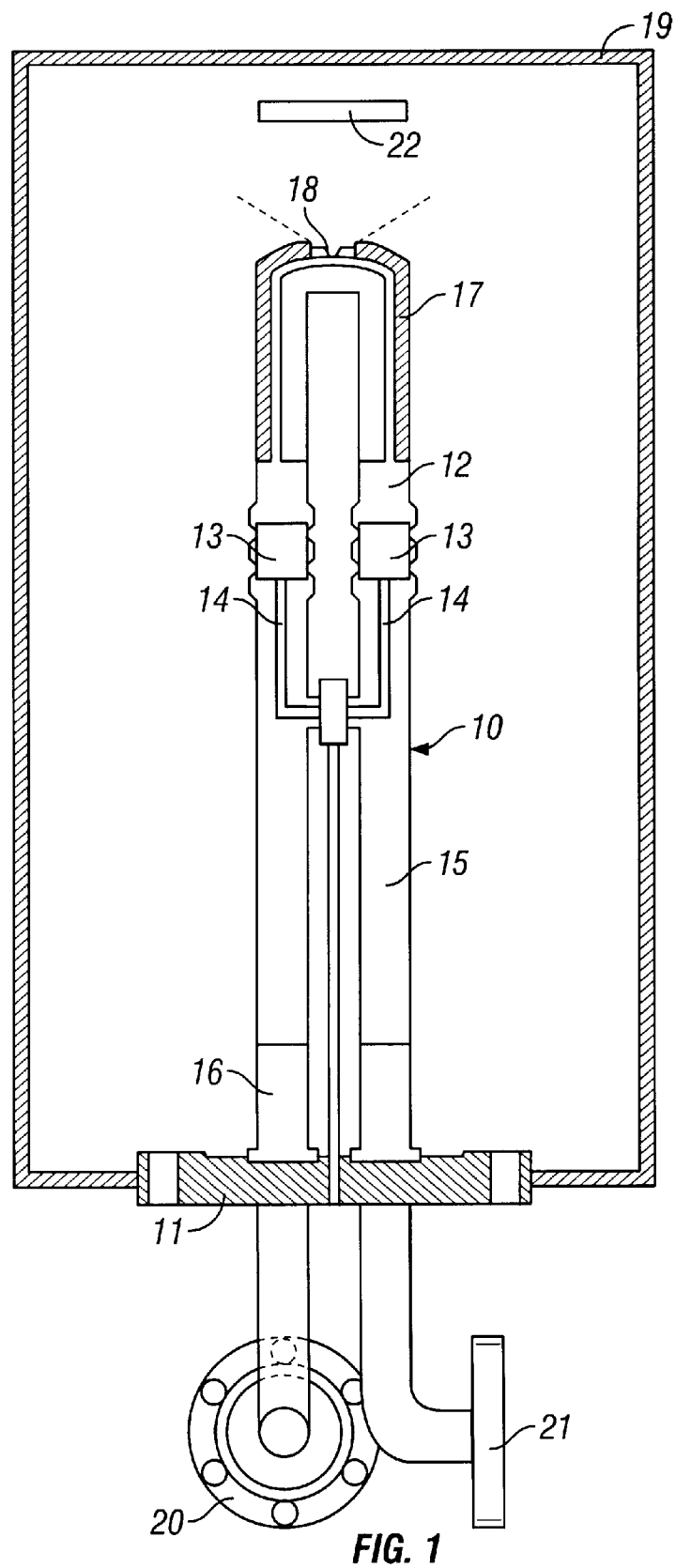
FIG. 1 is a diagram illustrating a continuous discharge plasma cell of the prior art arranged in a vacuum chamber.

It comprises an envelope 25, in glass, quartz, alumina or Pyrex for example, having a simple shape, such as a bell shape for example, comprising electrodes, that is to say at least one cathode 26 and one anode 27. It is provided in its upper part with a discharge opening 29, a first flange 11 of CF 35 type, as in the cell illustrated in FIG. 1, allowing fixation in vacuum chamber 19. The pressure in the cell P' is higher than pressure P in said chamber which is in the region of $10^{-5}$ mbar.

Electrodes 26 and 27 which can be dismounted, assembled on a second removable flange 28 of CF 19 type, have no contact with the glass wall 25. An opening 31 allowing entry of gas 32 is provided in the lower part of the envelope located between the two flanges 11 and 28.

The electrodes can be supplied by direct, alternate or pulsed voltage in order to set up, depending on the intended application, a continuous or discontinuous discharge of atomic species over a time course.

To prevent a plasma occurring "directly" between the two electrodes 26 and 27 creating atomic species, the cell also comprises an electrically insulated physical separation 30 between the electrodes, this separation possibly being made of a quartz tube 30 for example surrounding cathode 26 as illustrated in FIG. 2.

This physical separation 30 must meet two criteria. Firstly, it must be in electric insulating material, such as glass, quartz, alumina or Pyrex for example. Secondly, it must materially separate the anode from the cathode. Its shape is therefore not essential; it may for example be of cylindrical shape as shown in FIG. 2, or any other closed shape surrounding the cathode, or of planar shape.

This physical separation 30 is intended to serve the following purposes:

to set up a particular operating rate which creates atomic species
to cause "beam" 34 connecting anode 27 to cathode 26 to pass close to the discharge opening 29. The particles subjected to pressure P' higher than outside pressure P are then discharged through this opening 29, following an emission spectrum 33.

Through the positioning of separation 30, active species can be created at opening 29. In the absence of this separation 30, another stable plasma flow would be set up between anode 27 and cathode 26 without producing atomic species at opening 29.

Chemical analysis studies have shown that with the cell of the invention, through the creation of hydrogen atoms, it is possible to fully remove the oxide layer on several materials (CdTe, GaAs . . . ) through the creation of volatile species ($H_2O$—OH). It can also be used to remove a certain number of surface contaminants (carbon, chlorine, bromine) through the creation of other volatile species ($CH_4$—HCl—HBr).

Said cell, whose operation is very simple, allows for:

Easy dismounting. All that is required is to dismount the electrode-holder flange 28 to gain access to the inside of glass envelope 25, providing for easy cleaning and possible replacement of the electrodes.

The possible use of a single cathode 26 and several anodes 27, arranged such as to be able to electrically select the anode specific to the intended application without having to change the cell.

REFERENCES

[1] Thesis by D. Pagnon on $O_2$ dissociation in oxygen discharges dated Sep. 24, 1992 entitled "Etude de la dissociation de $O_2$ dans les décharges d'oxygène—Application à la réalisation de sources d'atomes" (chapter 4—Etude d'une source d'atomes 0—pages 71 to 80).

What is claimed is:

1. A plasma cell attached to a vacuum chamber, comprising:
   a flange removably coupled to the vacuum chamber to attach said plasma cell to the vacuum chamber;
   an outer envelope coupled to said flange, said outer envelope having a discharge opening;
   a plurality of electrodes mounted within said outer envelope, each of said plurality of electrodes having one cathode and at least one anode;
   an electrode-holder flange removably coupled to said plasma cell; and
   an electrical separator located between said at least one anode and said cathode.

2. The plasma cell of claim 1 further comprising a gas inlet coupled to said plasma cell.

3. The plasma cell of claim 1 wherein said outer envelope is bell-shaped.

4. The plasma cell of claim 1 wherein said outer envelope is made of an electrical insulating material.

5. The plasma cell of claim 4 wherein said electrical insulating material is glass.

6. The plasma cell of claim 1 wherein said cathode is substantially enclosed by said electrical separator.

7. The plasma cell of claim 1 wherein said electrical separator is made of an electrical insulating material.

8. The plasma cell of claim 7 wherein said electrical insulating material is quartz.

9. The plasma cell of claim 7 wherein said electrical insulting material is glass.

10. The plasma cell of claim 2 wherein said gas inlet is substantially located between said flange and said electrode-holder flange.

* * * * *